United States Patent
Yu et al.

(10) Patent No.: US 9,064,732 B2
(45) Date of Patent: Jun. 23, 2015

(54) SEMICONDUCTOR DEVICE INCLUDING WORK FUNCTION CONTROL FILM PATTERNS AND METHOD FOR FABRICATING THE SAME

(71) Applicant: Samsung Electronics Co., Ltd., Suwon-si (KR)

(72) Inventors: Cheong-Sik Yu, Seoul (KR); Choel-Hwyi Bae, Gunpo-Si (KR); Ju-Youn Kim, Suwon-si (KR); Chang-Min Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 78 days.

(21) Appl. No.: 13/902,099

(22) Filed: May 24, 2013

(65) Prior Publication Data

US 2014/0061813 A1 Mar. 6, 2014

(30) Foreign Application Priority Data

Aug. 31, 2012 (KR) .................. 10-2012-0096620

(51) Int. Cl.
*H01L 21/70* (2006.01)
*H01L 27/11* (2006.01)
*H01L 21/8238* (2006.01)

(52) U.S. Cl.
CPC ...... *H01L 27/1104* (2013.01); *H01L 21/82385* (2013.01); *H01L 21/823842* (2013.01); *H01L 27/1116* (2013.01)

(58) Field of Classification Search
CPC .................. H01L 27/1104; H01L 21/823842; H01L 21/82385; H01L 27/1116
USPC ................................................. 257/369, 407
See application file for complete search history.

(56) References Cited

U.S. PATENT DOCUMENTS

| | | | |
|---|---|---|---|
| 6,373,111 B1 * | 4/2002 | Zheng et al. ................. 257/407 |
| 7,521,765 B2 | 4/2009 | Tsutsumi et al. | |
| 7,718,496 B2 | 5/2010 | Frank et al. | |
| 7,728,392 B2 | 6/2010 | Yang et al. | |
| 7,732,872 B2 | 6/2010 | Cheng et al. | |
| 7,750,416 B2 | 7/2010 | Lee et al. | |
| 7,943,460 B2 | 5/2011 | Mo et al. | |
| 7,964,918 B2 | 6/2011 | Kanegae et al. | |
| 8,183,644 B1 * | 5/2012 | Chuang et al. ................ 257/388 |
| 8,269,284 B2 | 9/2012 | Nil et al. | |
| 8,384,160 B2 | 2/2013 | Onishi et al. | |
| 2004/0137703 A1 * | 7/2004 | Gao et al. ....................... 438/592 |
| 2010/0124805 A1 * | 5/2010 | Na et al. ......................... 438/216 |

(Continued)

FOREIGN PATENT DOCUMENTS

| | | |
|---|---|---|
| JP | 2004079705 | 3/2004 |
| JP | 2011165764 | 8/2011 |
| KR | 1020100080412 | 7/2010 |

*Primary Examiner* — Kevin Parendo
(74) *Attorney, Agent, or Firm* — Onello & Mello, LLP.

(57) ABSTRACT

A semiconductor device includes a semiconductor substrate including a first region and a second region, a first high-k dielectric film pattern on the first region, a second high-k dielectric film pattern on the second region and having the same thickness as the first high-k dielectric film pattern. First and second work function control film patterns are positioned on the high-k dielectric film patterns of the first region. Third and fourth work function control patterns are positioned on the high-k dielectric film pattern of the second region, the first work function control pattern being thicker than the third work function control pattern and the fourth work function control pattern being thicker than the second.

14 Claims, 12 Drawing Sheets

(56) References Cited

U.S. PATENT DOCUMENTS

| | | |
|---|---|---|
| 2010/0164007 A1 | 7/2010 | Onishi et al. |
| 2010/0285643 A1* | 11/2010 | Lee et al. .................. 438/232 |
| 2011/0062526 A1* | 3/2011 | Xu et al. .................. 257/369 |
| 2011/0193173 A1 | 8/2011 | Nii et al. |
| 2011/0198699 A1* | 8/2011 | Hung et al. .................. 257/369 |
| 2011/0204450 A1 | 8/2011 | Moriya |
| 2011/0271144 A1* | 11/2011 | James et al. .................. 714/14 |
| 2012/0181586 A1* | 7/2012 | Luo et al. .................. 257/288 |
| 2014/0061811 A1* | 3/2014 | Chien et al. .................. 257/369 |

* cited by examiner

SEMICONDUCTOR DEVICE INCLUDING WORK FUNCTION CONTROL FILM PATTERNS AND METHOD FOR FABRICATING THE SAME

CROSS-REFERENCE TO RELATED APPLICATION

This application claims priority from Korean Patent Application No. 10-2012-0096620 filed on Aug. 31, 2012 in the Korean Intellectual Property Office, and all the benefits accruing therefrom under 35 U.S.C. 119, the contents of which in its entirety are herein incorporated by reference.

BACKGROUND

1. Field of the Invention

Exemplary embodiments in accordance with principles of inventive concepts relate to a semiconductor device and a method for fabricating the same.

2. Description of the Related Art

As the feature size of an MOS transistor decreases, the length of a gate and a length of a channel formed under the gate also decrease. As the thickness of a silicon oxide film typically used as a gate insulation film shrinks, the electrical properties of the film may be negatively affected. As a result, high-k dielectric films, having high dielectric constants, may be used in place of conventional silicon oxide films. A high-k dielectric film can reduce leakage current between a gate electrode and a channel region while maintaining a small equivalent oxide thickness. Additionally, the polysilicon typically used as a gate material has larger resistance than most metals and, therefore, a polysilicon gate electrode may be replaced by a metal gate electrode.

SUMMARY

An exemplary semiconductor device in accordance with principles of inventive concepts includes a semiconductor substrate including a first region and a second region; a first high-k dielectric film pattern on the first region; a second high-k dielectric film pattern of the same thickness as the first high-k dielectric film pattern, on the second region; a first work function control film pattern on the first high-k dielectric film pattern and having a first thickness; a second work function control film pattern on the first work function control film pattern and having a second thickness; a third work function control film pattern on the second high-k dielectric film pattern made of the same material as, and being thinner than, the first work function control pattern; and a fourth work function control film pattern on the third work function control film pattern made of the same material as, and being thicker than, the second work function control film pattern.

In accordance with principles of inventive concepts the first and third work function control film patterns include metal oxide film patterns.

In accordance with principles of inventive concepts the metal oxide film patterns include LaO, $Y_2O_3$, $Lu_2O_3$, SrO or combinations thereof.

In accordance with principles of inventive concepts the second and fourth work function control film patterns include metal nitride film patterns.

In accordance with principles of inventive concepts the metal nitride film pattern is one of a single film made of TiN and a double layered film made of TiN/TaN.

In accordance with principles of inventive concepts the combined thicknesses of the first and second work function control film patterns is equal to the combined thicknesses of the third and fourth work function control film patterns.

In accordance with principles of inventive concepts the first region includes a logic region and the second region includes a memory region.

In accordance with principles of inventive concepts the memory includes a static random access memory (SRAM).

In accordance with principles of inventive concepts the logic region includes a NFET logic region and a P-type field effect transistor (PFET) logic region, the memory region includes an N-type field effect transistor (NFET) memory region and a PFET memory region, and the semiconductor further comprises a P-type work function control film pattern on the first high-k dielectric film on the PFET logic region and the second high-k dielectric film the PFET memory region and not on the first high-k dielectric film on the NFET logic region and the second high-k dielectric film on the NFET memory region.

In accordance with principles of inventive concepts wherein the P-type work function control film pattern includes a TiN pattern.

In accordance with principles of inventive concepts P-type work function control film pattern has a thickness greater than that of the fourth work function control film pattern.

In accordance with principles of inventive concepts a semiconductor device includes an interlayer dielectric film on the semiconductor substrate and including a trench, at least one of the first high-k dielectric film pattern, the first work function control film pattern, and the second work function control film pattern is arranged to upwardly extend along sidewalls of the trench, and at least one of the second high-k dielectric film pattern, the third work function control film pattern, and the fourth work function control film pattern is arranged to upwardly extend along sidewalls of the trench.

In accordance with principles of inventive concepts a semiconductor device includes a semiconductor substrate including a logic area and an SRAM area; a logic device including a logic transistor on the logic area; and an SRAM including a memory transistor on the SRAM area, wherein each of the logic transistor and the memory transistor includes a first work function control film pattern and a second work function control film pattern to control work functions thereof according to thicknesses of the first and second work function control film patterns, the thickness of the first work function control film pattern of the logic transistor is greater than that of the first work function control film pattern of the memory transistor, and the thickness of the second work function control film pattern of the logic transistor is smaller than that of the second work function control film pattern of the memory transistor.

In accordance with principles of inventive concepts the second work function control film pattern is on the first work function control film pattern.

In accordance with principles of inventive concepts the first work function control film pattern includes include LaO, $Y_2O_3$, $Lu_2O_3$, SrO or combinations thereof, and the second work function control film pattern is one of a single film made of TiN and a double layered film made of TiN/TaN.

In accordance with principles of inventive concepts a semiconductor device includes semiconductor substrate including first and second regions having distinct functional characteristics; a first high-k dielectric film pattern on the first region; a second high-k dielectric film pattern of the same thickness as the first high-k dielectric film pattern, on the second region; work function control film patterns on each of the first and second high-k dielectric film patterns, the ratios of the thicknesses of the work function control film patterns selected to control the work functions of transistors in the first and second regions.

In accordance with principles of inventive concepts the first region is a logic region including logic devices and the second region is a memory region including memory devices, each region including NFET and PFET transistors, the NFET transistors of the logic region including metal gate patterns equal in thickness to the metal gate patterns of the NFET transistors in the memory region, and the PFET transistors in the logic region including metal gate patterns equal in thickness to the metal gate patterns of the PFET transistors in the memory region.

In accordance with principles of inventive concepts the logic region includes a first work function control film pattern on the first high-k dielectric film pattern, a second work function control film pattern on the first work function control film pattern; and the memory region includes a third work function control film pattern on the second high-k dielectric film pattern made of the same material as, and being thinner than, the first work function control pattern and a fourth work function control film pattern on the third work function control film pattern made of the same material as, and being thicker than, the second work function control film pattern.

In accordance with principles of inventive concepts a memory module includes the semiconductor device in accordance with principles of inventive concepts.

In accordance with principles of inventive concepts a wireless device includes a memory module in accordance with principles of inventive concepts.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF EXEMPLARY EMBODIMENTS

Figure 1:
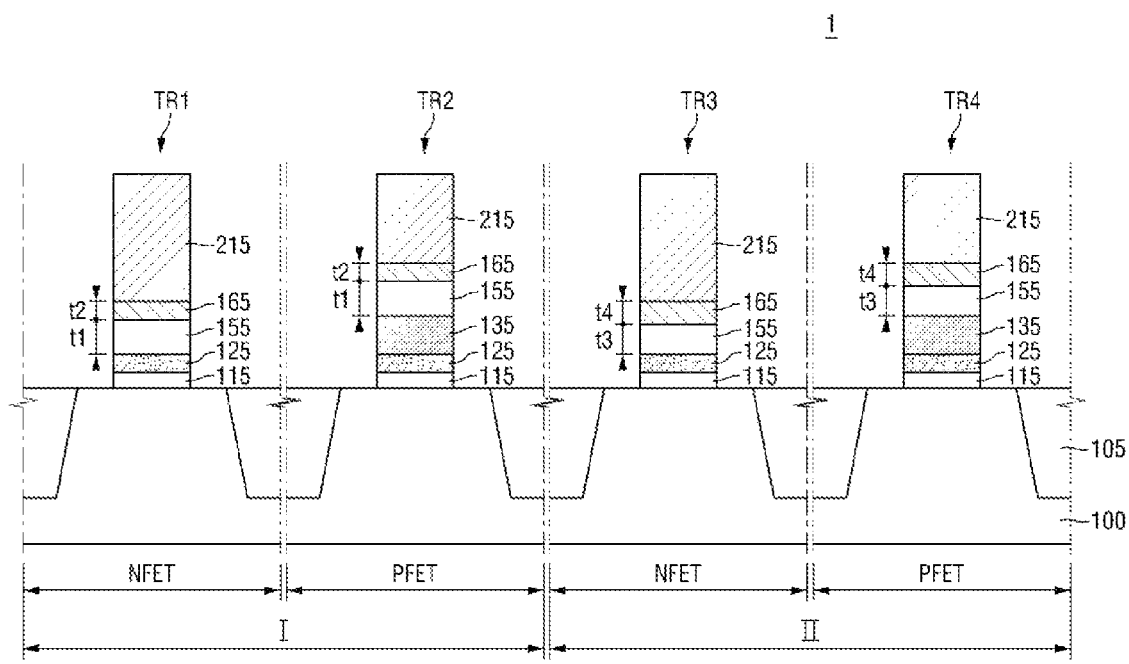
FIG. 1 is a cross-sectional view of a semiconductor device in accordance with principles of inventive concepts.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). The word "or" is used in an inclusive sense, unless otherwise indicated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "bottom," "below," "lower," or "beneath" other elements or features would then be oriented "atop," or "above," the other elements or features. Thus, the exemplary terms "bottom," or "below" can encompass both an orientation of above and below, top and bottom. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of an exemplary embodiment of a semiconductor device in accordance with principles of inventive concepts. Semiconductor device 1 includes a plurality of transistors TR1 to TR4 formed on a semiconductor substrate 100.

In accordance with principles of inventive concepts, semiconductor substrate 100 may include a first region I and a second region II. In some exemplary embodiments in accordance with principles of inventive concepts, the first region I of the semiconductor substrate 100 may be a logic area upon which logic devices are formed, and the second region II of the semiconductor substrate 100 may be a memory area upon which memory devices are formed, for example. In some exemplary embodiments in accordance with principles of inventive concepts, the first region I of the semiconductor substrate 100 may be a low voltage logic area upon which low voltage logic devices are formed, and the second region II of the semiconductor substrate 100 may be a high voltage logic area upon which high voltage logic devices are formed.

In some exemplary embodiments in accordance with principles of inventive concepts, a device isolation film 105, such as a shallow trench isolation (STI), may be formed in the semiconductor substrate 100 to define an active region. The semiconductor substrate 100 may be made of one or more semiconductor materials selected from the group consisting of Si, Ge, SiGe, GaP, GaAs, SiC, SiGeC, InAs and InP. In addition, in some exemplary embodiments in accordance with principles of inventive concepts, the semiconductor substrate 100 may be formed of a silicon on insulator (SOI), for example.

A plurality of transistors TR1-TR4 having different conductivity types may be formed on the respective regions I and II of the semiconductor substrate 100. That is to say, as shown in FIG. 1, for example, the first transistor TR1 having N-type conductivity and the second transistor TR2 having P-type conductivity may be formed on the first region I of the semiconductor substrate 100, and the third transistor TR3 having N-type conductivity and the fourth transistor TR4 having P-type conductivity may be formed on the second region II of the semiconductor substrate 100. In exemplary embodiments in accordance with principles of inventive concepts, the first transistor TR1 may include an interface film pattern 115, a high-k dielectric film pattern 125, a first work function control film pattern 155, a second work function control film pattern 165 and a metal gate pattern 215.

In exemplary embodiments in accordance with principles of inventive concepts, the interface film pattern 115 may improve the interface between the semiconductor substrate 100 and the high-k dielectric film pattern 125, for example. The interface film pattern 115 may include a material layer having a low dielectric constant (k) of 9 or less, for example, a silicon oxide film (having k of approximately 4) or a silicon oxynitride film (having k of approximately 4 to 8 according to amounts of the oxygen and nitrogen atoms). Alternatively, the interface film pattern 115 may be made of silicate or a combination of the films stated above.

The high-k dielectric film pattern 125 may include a high-k dielectric material. For example, the high-k dielectric film pattern 125 may include materials selected from the group consisting of $HfO_2$, $ZrO_2$, $Ta_2O_5$, $TiO_2$, $SrTiO_3$, $BaTiO_3$, and $SrTiO_3$. The high-k dielectric film pattern 125 may be formed to have an appropriate thickness according to the kind of device to be formed. For example, in a case where the high-k dielectric film pattern 125 is made of $HfO_2$, it may be formed to have a thickness of approximately 50 Å or less (in a range of 5 to 50 Å, for example), but aspects of inventive concepts are not limited thereto.

The first work function control film pattern 155 of the first transistor TR1 may be foamed on the high-k dielectric film pattern 125, as shown in FIG. 1. In some exemplary embodiments in accordance with principles of inventive concepts, the first work function control film pattern 155 may be, for example, a metal oxide film pattern. For example, in accordance with principles of inventive concepts, the first work function control film pattern 155 may include LaO, $Y_2O_3$, $Lu_2O_3$, SrO, or combinations thereof, but aspects of inventive concepts are not limited thereto.

As shown in FIG. 1, the second work function control film pattern 165 may be formed on the first work function control film pattern 155 of the first transistor TR1, for example. In some exemplary embodiments in accordance with principles of inventive concepts, the second work function control film pattern 165 may be, for example, a metal nitride film pattern. For example, in some embodiments in accordance with principles of inventive concepts, the second work function control film pattern 165 may include, at least one of TiN and TaN. In exemplary embodiments in accordance with principles of inventive concepts, the second work function control film pattern 165 may be, for example, a single film made of TiN or a double layered film consisting of a TiN lower film and a TaN upper film, but aspects in accordance with principles of inventive concepts are not limited thereto.

The first work function control film pattern 155 and the second work function control film pattern 165, forming a part of first transistor TR1, may be formed to have a first thickness t1 and a second thickness t2, respectively, as shown in FIG. 1. In this exemplary embodiment in accordance with principles of inventive concepts, a combination of the first work function control film pattern 155 having the first thickness t1 and the second work function control film pattern 165 having the second thickness t2 may be used to control a work function of the first transistor TR1. Such a combination will be described in more detail in the discussion related to the following figures.

In an exemplary embodiment in accordance with principles of inventive concepts, metal gate pattern 215 may be formed on the second work function control film pattern 165 of the first transistor TR1. In an exemplary embodiment in accordance with principles of inventive concepts, the metal gate pattern 215 may be formed of Al, W, etc., but aspects of inventive concepts are not limited thereto. In particular, in embodiments where the metal gate pattern 215 of the first transistor TR1 is made of Al, a barrier film (not shown) may be positioned under the metal gate pattern 215. The barrier film (not shown) may prevent a material of the metal gate pattern 215 (e.g., Al), from being diffused to affect the high-k dielectric film pattern 125.

In an exemplary embodiment in accordance with principles of inventive concepts, the second transistor TR2 may include an interface film pattern 115, a high-k dielectric film pattern 125, a P-type work function control film pattern 135, a first work function control film pattern 155, a second work function control film pattern 165 and a metal gate pattern 215, for example.

The interface film pattern 115 and the high-k dielectric film pattern 125 included in the second transistor TR2 may be the as described in the discussion related to the first transistor TR1. That is, materials forming the interface film pattern 115 and the high-k dielectric film pattern 125 of the second transistor TR2 and thicknesses thereof may be the substantially the same as those of the first transistor TR1.

The P-type work function control film pattern 135 may be formed on the high-k dielectric film pattern 125 of the second transistor TR2. In an exemplary embodiment in accordance with principles of inventive concepts, the P-type work function control film pattern 135 may control a work function of a P-type field effect transistor (PFET), thereby controlling operating characteristics of the PFET. In exemplary embodiments in accordance with principles of inventive concepts, the P-type work function control film pattern 135 may be, for example, a TiN film, but aspects of inventive concepts are not limited thereto.

In accordance with principles of inventive concepts, the first work function control film pattern 155, the second work function control film pattern 165 and the metal gate pattern 215 may be sequentially formed on the P-type work function control film pattern 135 of the second transistor TR2. As described above with regard to the first transistor TR1, the first work function control film pattern 155 and the second work function control film pattern 165 may also be formed to have the first thickness t1 and the second thickness t2, respectively. That is, in an exemplary embodiment in accordance with principles of inventive concepts, the thicknesses of the first transistor TR1 and second transistor TR2 first work function control film patterns 155 are equal (i.e., equal to thickness t1); and the thicknesses of the first transistor TR1 and second transistor TR2 second work function control film patterns 165 are equal (i.e., equal to thickness t2).

In an exemplary embodiment in accordance with principles of inventive concepts, the second transistor TR2 may further include the P-type work function control film pattern 135 not included in the first transistor TR1. In such an exemplary embodiment, the thickness of the metal gate pattern 215 forming the second transistor TR2 may be smaller than that of the metal gate pattern 215 forming the first transistor TR1 due to the additionally provided P-type work function control film pattern 135.

In an exemplary embodiment in accordance with principles of inventive concepts, the N-type first transistor TR1 and the P-type second transistor TR2, formed on the first region I of the semiconductor substrate 100, may include the first work function control film pattern 155 having the first thickness t1 and the second work function control film pattern 165 having the second thickness t2, respectively.

In an exemplary embodiment in accordance with principles of inventive concepts, the third transistor TR3 formed on the second region II of the semiconductor substrate 100 may include an interface film pattern 115, a high-k dielectric film pattern 125, a third work function control film pattern 195, a fourth work function control film pattern 205 and a metal gate pattern 215.

In such an exemplary embodiment, the interface film pattern 115 and the high-k dielectric film pattern 125 may be substantially the same as those of the first and second transistors TR1 and TR2. In particular, thicknesses of the high-k dielectric film patterns 125 included in the first and second transistors TR1 and TR2 may be equal to a thickness of the high-k dielectric film pattern 125 included in the third transistor TR3, for example.

The third work function control film pattern 195 formed on the high-k dielectric film pattern 125 may be made of the same material as the first work function control film pattern 155. That is to say, in exemplary embodiments in accordance with principles of inventive concepts, the third work function control film pattern 195 may be a metal oxide film pattern including, for example, LaO, $Y_2O_3$, $Lu_2O_3$, SrO or combinations thereof, for example.

In an exemplary embodiment in accordance with principles of inventive concepts, the fourth work function control film pattern 205 may be formed on the third work function control film pattern 195 of the third transistor TR1. In such an exemplary embodiment, the third work function control film pattern 195 may also be made of the same material as the second work function control film pattern 165. That is to say, in exemplary embodiments in accordance with principles of inventive concepts, the fourth work function control film pattern 205 may include, for example, at least one of TiN and TaN. The fourth work function control film pattern 205 may be a metal nitride film pattern formed of a single film made of TiN and a double layered film made of TiN/TaN, for example.

The third work function control film pattern 195 and the fourth work function control film pattern 205, of the third transistor TR3, may be formed to have a third thickness t3 and a fourth thickness t4, respectively, as shown. In such an exemplary embodiment, the third thickness t3 may be smaller than the first thickness t1, and the fourth thickness t4 may be greater than the second thickness t2.

In an exemplary embodiment in accordance with principles of inventive concepts, a combination of the third work function control film pattern 195 having the third thickness t3 and the fourth work function control film pattern 205 having the fourth thickness t4 may be used to control a work function of the third transistor TR3, as will be described in greater detail in the discussion related to the following figures.

In an exemplary embodiment in accordance with principles of inventive concepts, metal gate pattern 215 may also be formed on the third work function control film pattern 195 of the third transistor TR3. In some exemplary embodiments of the present invention, the metal gate pattern 215 may be &Lined of Al, W, etc., for example.

In an exemplary embodiment in accordance with principles of inventive concepts, the fourth transistor TR4 formed on the second region II of the semiconductor substrate 100 may include an interface film pattern 115, a high-k dielectric film pattern 125, a P-type work function control film pattern 135, a third work function control film pattern 195, a fourth work function control film pattern 205 and a metal gate pattern 215.

The fourth transistor TR4 may be configured to have the P-type work function control film pattern 135 added to the structure of the third transistor TR3. In such an exemplary embodiment, in a case where the P-type work function control film pattern 135 is made of, for example, TiN, and the fourth work function control film pattern 205 is made of, for example, TiN, the thickness of the P-type work function control film pattern 135 may be greater than that of the fourth work function control film pattern 205, for example. The P-type work function control film pattern 135 may be substantially the same as described above with regard to the second transistor TR2, and, therefore, a detailed description thereof will not be repeated here.

Referring again to FIG. 1, in exemplary embodiments in accordance with principles of inventive concepts, work functions of the first transistor TR1 and the second transistor TR2, formed on the first region I of the semiconductor substrate 100, may be controlled by a combination of the first work function control film pattern 155 having the first thickness t1 and the second work function control film pattern 165 having the second thickness t2. Work functions of the third transistor TR3 and the fourth transistor TR4, formed on the second region II of the semiconductor substrate 100, may be controlled by a combination of the third work function control film pattern 195 having the third thickness t3 and the fourth work function control film pattern 205 having the fourth thickness t4.

In exemplary embodiments in which the first and second transistors TR1 and TR2 formed on the first region I of the semiconductor substrate 100 are logic transistors, and the third and fourth transistors TR3 and TR4 formed on the second region II of the semiconductor substrate 100 are memory transistors, performance of the third and fourth transistors TR3 and TR4 may be affected by process variations, which may cause a serious problem. That is to say, since a memory transistor is generally used in storing and maintaining data, performance of the memory transistor may be adversely affected by process variations, which may result in significant deterioration of product performance, compared to the case of a logic transistor. Accordingly, it is important to form a memory transistor so as not to be adversely affected by the process variations.

In order to prevent performance of a transistor from deteriorating due to process variations, one may suppress the thickness of the high-k dielectric film pattern 125. However, in order to increase the yield, the first and second transistors TR1 and TR2 used as logic transistors and the third and fourth transistors TR3 and TR4 used as memory transistors may often be formed at the same time using the same process. In a process of forming the high-k dielectric film pattern 125, it may be difficult to accurately control the thickness of the high-k dielectric film pattern 125. As a result, it may be difficult to form the high-k dielectric film patterns 125 formed on the first region I and the second region II of the semiconductor substrate 100 to have different thicknesses.

In order to solve the problem, characteristics of memory transistors (e.g., TR3 and TR4) may be controlled by selectively performing ion implantation on the memory transistors. This method, however, has a disadvantage in that it is difficult to accurately control the characteristics of memory transistors as the size of a device gradually shrinks and a line width is reduced.

Therefore, in exemplary embodiments in accordance with principles of inventive concepts, even if thicknesses of the high-k dielectric film patterns 125 formed on the first and second regions I and II of the semiconductor substrate 100 are equal to each other, work functions of the first work function control film pattern 155 and the second work function control film pattern 165 are controlled by adjusting a thickness ratio of the first work function control film pattern 155 and the second work function control film pattern 165, thereby forming the memory transistors (e.g., TR3 and TR4) so as to be less affected by the process variations. That is, in accordance with principles of inventive concepts, the thickness t3 of the third work function control film pattern 195 included in the memory transistor (e.g., TR3, TR4) may be smaller than the thickness t1 of the first work function control film pattern 155 included in the logic transistor (e.g., TR1, TR2), and the thickness t4 of the fourth work function control film pattern 205 included in the memory transistor (e.g., TR3, TR4) may be greater than the thickness t2 of the second work function control film pattern 165 included in the logic transistor (e.g., TR1, TR2). In this manner, in accordance with principles of inventive concepts, the memory transistor (e.g., TR3, TR4) may be less sensitive to the process variations than the logic transistor (e.g., TR1, TR2), thereby improving product reliability.

Additionally, in exemplary embodiments in accordance with principles of inventive concepts, the sum of the first thickness t1 of the first work function control film pattern 155 and the second thickness t2 of the second work function control film pattern 165 and the sum of the third thickness t3 of the third work function control film pattern 195 and the fourth thickness t4 of the fourth work function control film pattern 205 may equal. In an exemplary embodiment in which the sum of the first thickness t1 and the second thickness t2 is equal to the sum of the third thickness t3 and the fourth thickness t4, the thickness of the metal gate pattern 215 included in the first transistor TR1 may be equal to a thickness of the metal gate pattern 215 included in the third transistor TR3, and the thickness of the metal gate pattern 215 included in the second transistor TR2 may be equal to the thickness of the metal gate pattern 215 included in the fourth transistor TR4. In such exemplary embodiments in accordance with principles of inventive concepts, the work functions of the transistors may be more accurately controlled, because determinant factors for controlling work functions of the respective transistors can be reduced.

Hereinafter, an exemplary method in accordance with principles of inventive concepts for fabricating a semiconductor device will be described with reference to FIGS. 2 to 9 together with FIG. 1.

FIGS. 2 to 9 are diagrams illustrating intermediate process steps and will be used to describe an exemplary method for fabricating a semiconductor device according to principles of inventive concepts.

Figure 2:
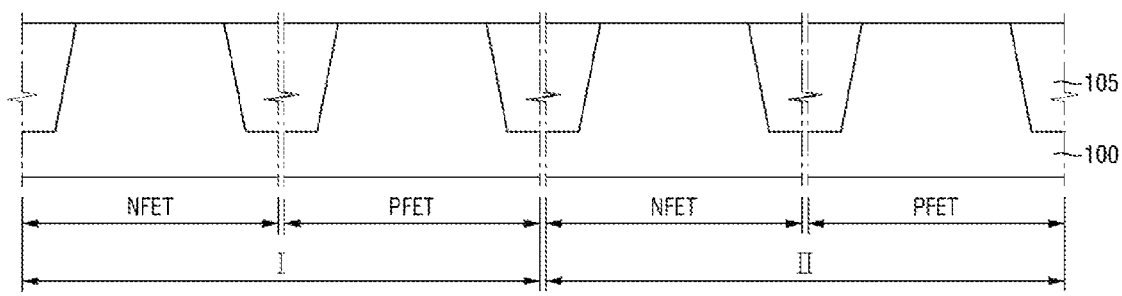
FIGS. 2 to 9 are diagrams illustrating intermediate process steps for explaining a method for fabricating a semiconductor device in accordance with principles of inventive concepts.

Referring to FIG. 2, in a method in accordance with principles of inventive concepts, semiconductor substrate 100 including the first region I and the second region II is provided. In such an exemplary embodiment, the first region I may be a logic area upon which logic devices are formed and may include an NFET logic area and a PFET logic area, for example. The second region II may be a memory area upon which memory devices are formed and may include an NFET memory area and a PFET memory area. The device isolation film 105 may be a shallow trench isolation (STI) and an active region may be defined in the semiconductor substrate 100 by the device isolation film 105.

Figure 3:
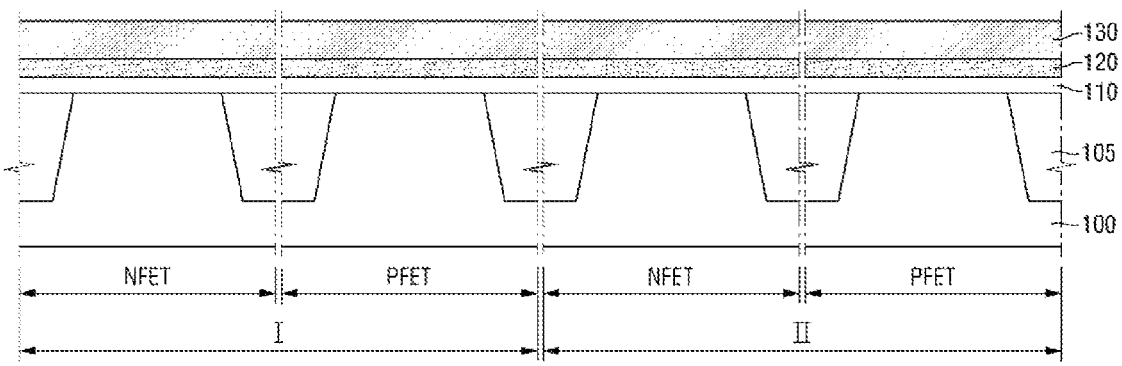

Referring to FIG. 3, the interface film 110, the high-k dielectric film 120 and the P-type work function control film 130 may be sequentially formed throughout the first region I and the second region II of the semiconductor substrate 100.

In accordance with principles of inventive concepts, interface film 110 may include a material layer having a low dielectric constant (k) of 9 or less, for example, a silicon oxide film (having k of approximately 4) or a silicon oxynitride film (having k of approximately 4 to 8 according to amounts of the oxygen and nitrogen atoms). Alternatively, the interface film 110 may include silicate or a combination of the films stated above. The high-k dielectric film 120 may include, for example, materials selected from the group consisting of $HfO_2$, $ZrO_2$, $Ta_2O_5$, $TiO_2$, $SrTiO_3$, $BaTiO_3$, and $SrTiO_3$. The P-type work function control film 130 may be, for example, a TiN film, for example.

Figure 4:
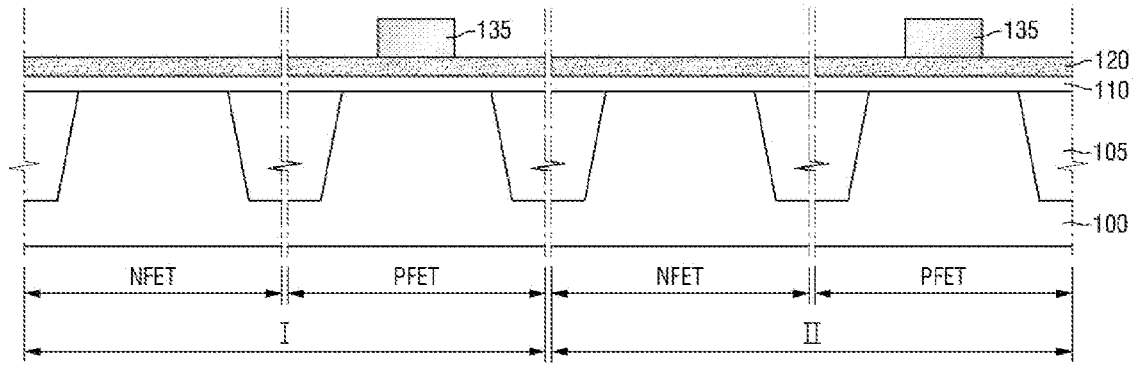

Referring to FIG. 4, the P-type work function control film (130 of FIG. 3) is patterned to foam the P-type work function control film pattern 135. In accordance with principles of inventive concepts, a photoresist pattern (not shown) may be formed on the P-type work function control film (130 of FIG. 3), the P-type work function control film (130 of FIG. 3) may be patterned using the photoresist pattern as a mask to form the P-type work function control film pattern 135 shown in FIG. 4. In such an exemplary embodiment, the P-type work function control film pattern 135 may be formed on a PFET logic area positioned on the first region I of the semiconductor substrate 100 and on a PFET memory area positioned on the second region II of the semiconductor substrate 100.

Figure 5:
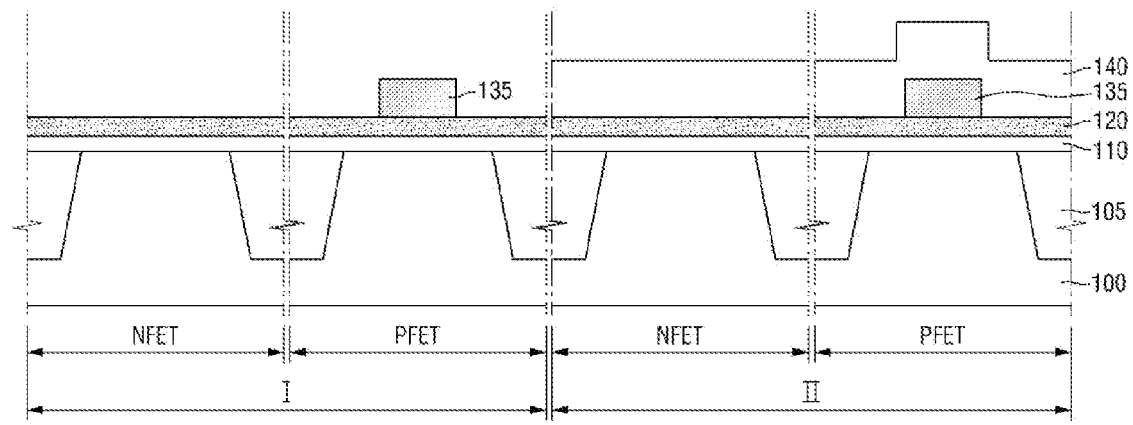

Referring to FIG. 5, in accordance with principles of inventive concepts, a first amorphous silicon layer 140 may be selectively formed on the high-k dielectric film 120 and the P-type work function control film pattern 135 positioned on the second region II of the semiconductor substrate 100. In particular, in accordance with principles of inventive concepts, after the first amorphous silicon layer 140 is formed throughout the first region I and the second region II of the semiconductor substrate 100, the high-k dielectric film 120 positioned on the first region I of the semiconductor substrate 100 and the first amorphous silicon layer 140 positioned on the P-type work function control film pattern 135 may be removed, thereby selectively forming the first amorphous silicon layer 140 on the high-k dielectric film 120 and the P-type work function control film pattern 135 positioned on the second region II of the semiconductor substrate 100.

Figure 6:
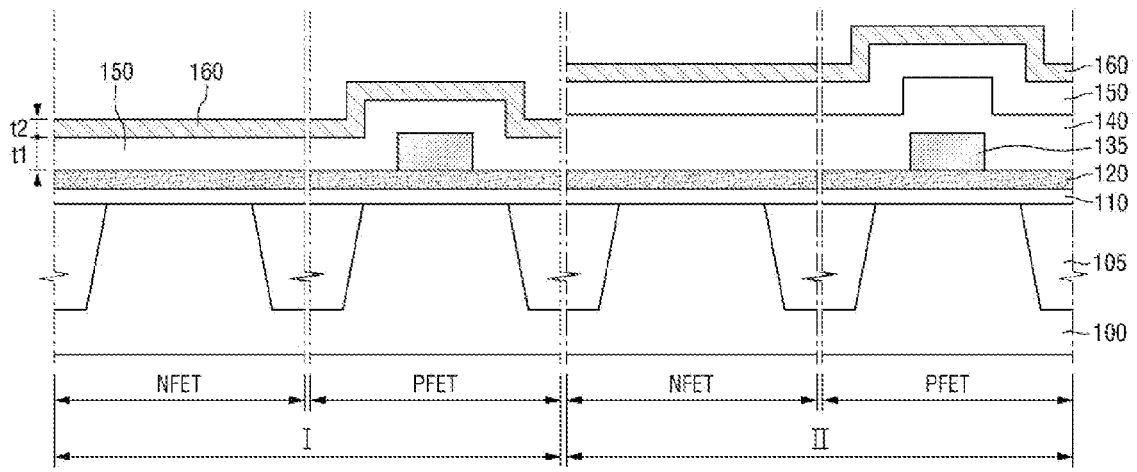

Referring to FIG. 6, a first work function control film 150 having a first thickness t1 and a second work function control film 160 having a second thickness t2 may be sequentially formed throughout the first region I and the second region II of the semiconductor substrate 100. In such an exemplary embodiment, the first work function control film 150 may include, for example, LaO, $Y_2O_3$, $Lu_2O_3$, SrO or combinations thereof, and the second work function control film pattern is one of a single film made of TiN and a double layered film made of TiN/TaN, for example.

Figure 7:
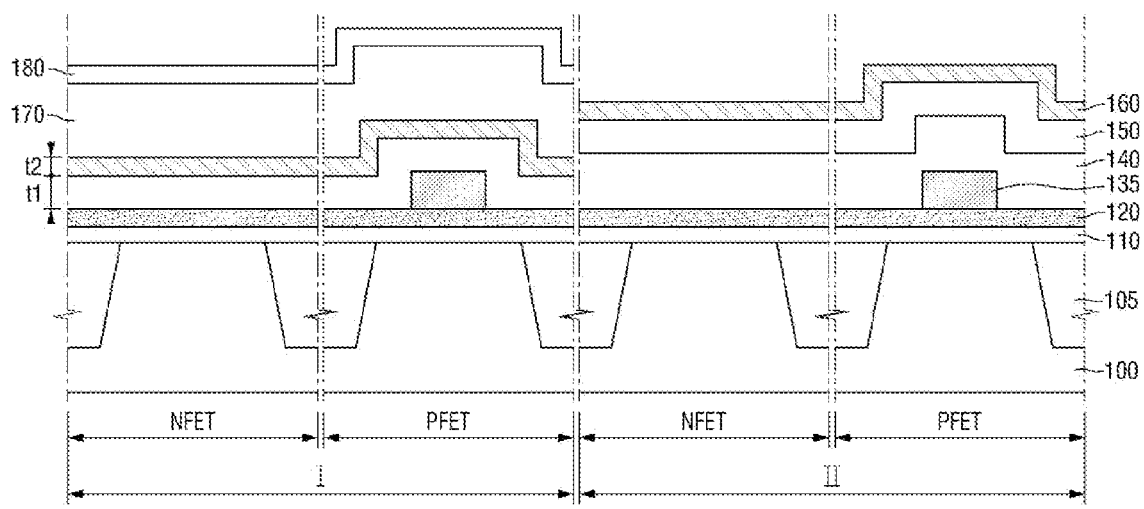

Referring to FIG. 7, in accordance with principles of inventive concepts, a second amorphous silicon layer 170 and a hard mask film 180 may be selectively formed on the second work function control film 160 positioned on the first region I of the semiconductor substrate 100. In particular, after the second amorphous silicon layer 170 and the hard mask film 180 are sequentially formed throughout the first region I and the second region II of the semiconductor substrate 100, a photoresist pattern (not shown) may be selectively formed on the hard mask film 180 positioned on the first region I of the semiconductor substrate 100. Then, the hard mask film 180 positioned on the second region I of the semiconductor substrate 100 may be removed using the photoresist pattern (not shown) as a mask. Next, the second amorphous silicon layer 170 positioned on the second region II of the semiconductor substrate 100 may be removed using the hard mask film 180 positioned on the first region I of the semiconductor substrate 100 as a mask, thereby selectively forming the second amorphous silicon layer 170 and the hard mask film 180 on the second region I of the semiconductor substrate 100, for example.

Figure 8:
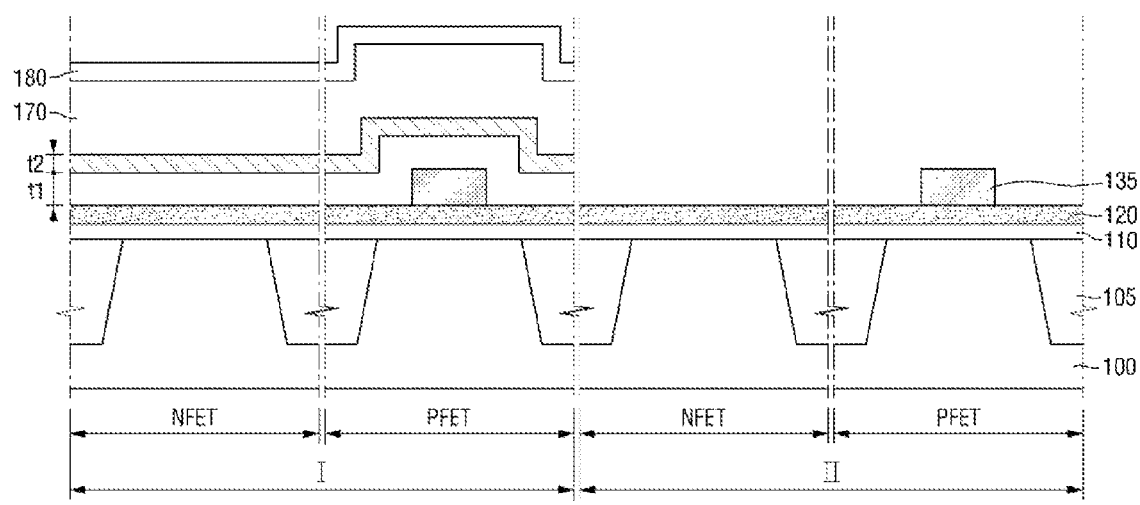

Referring to FIG. 8, in accordance with principles of inventive concepts, the second work function control film 160, the first work function control film 150 and the first amorphous silicon layer 140, formed on the second region II of the semiconductor substrate 100, are sequentially removed using the hard mask film 180 formed on the first region I of the semiconductor substrate 100 as a mask. In the removing, $NH_4OH$, SCl, HCL, etc. may be used as an etching solution, for example.

Figure 9:
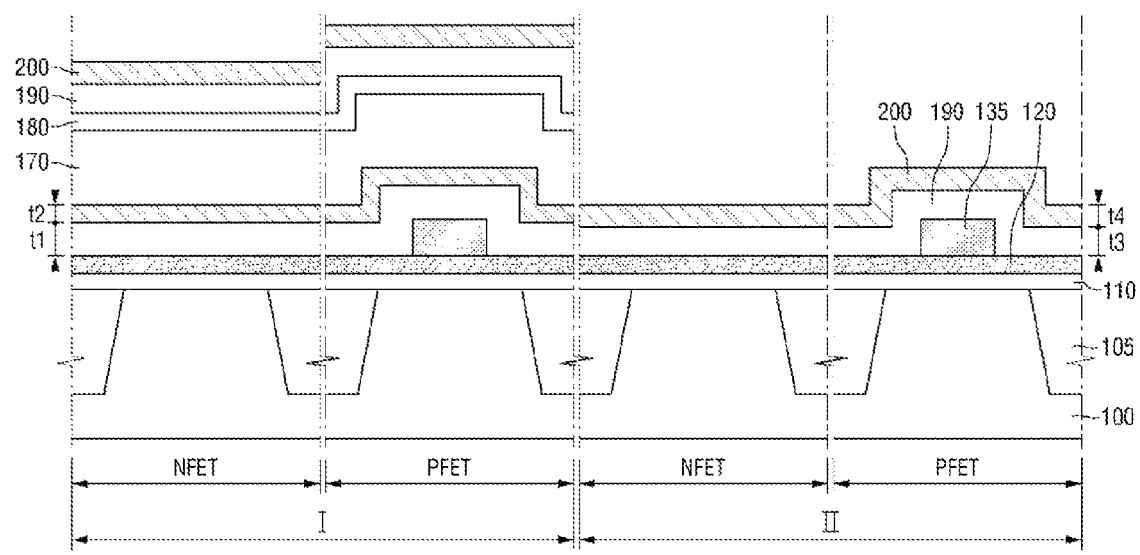

Referring to FIG. 9, in accordance with principles of inventive concepts, a third work function control film 190 having a third thickness t3 and a fourth work function control film 200 having a fourth thickness t4 may be sequentially formed throughout the first region I and the second region II of the semiconductor substrate 100. In such an exemplary embodiment, the third thickness t3 of the third work function control film 190 may be smaller than the first thickness t1 of the first work function control film 150, and the fourth thickness t4 of the fourth work function control film 200 may be greater than the second thickness t2 of the second work function control film 160, for example.

In exemplary embodiments in accordance with principles of inventive concepts, the third work function control film 190 and the fourth work function control film 200 may be made of the same materials as the first work function control film 150 and the second work function control film 160. That is to say, the third work function control film 190 may include, for example, LaO, $Y_2O_3$, $Lu_2O_3$, SrO or combinations thereof, and the fourth work function control film 200 may include, for example, a single film made of TiN and a double layered film made of TiN/TaN, for example.

In some exemplary embodiments in accordance with principles of inventive concepts, the sum of the first thickness t1 of the first work function control film 150 and the second thickness t2 of the second work function control film 160 is equal to the sum of the third thickness t3 of the third work function control film 190 and the fourth thickness t4 of the fourth work function control film 200, for example.

In an exemplary method in accordance with principles of inventive concepts, the fourth work function control film 200, the third work function control film 190, the hard mask film 180, and the second amorphous silicon layer 170, formed on the first region I of the semiconductor substrate 100, are sequentially removed, and a metal gate layer (not shown) is formed throughout the first region I and the second region II of the semiconductor substrate 100. The metal gate layer (not shown) and films formed under the metal gate layer may then be patterned, thereby fabricating the semiconductor device 1 shown in FIG. 1.

Figure 10:
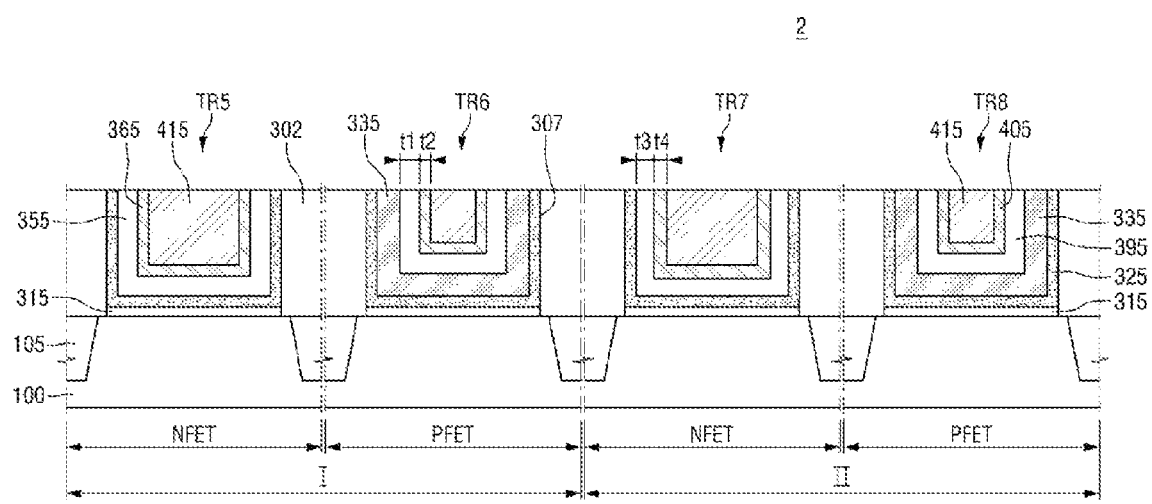
FIG. 10 is a cross-sectional view of a semiconductor device according to another exemplary embodiment in accordance with principles of inventive concepts.

A semiconductor device according to another exemplary embodiment in accordance with principles of inventive concepts will be described with reference to FIG. 10. The description will focus primarily on differences between previous and present exemplary embodiments. Semiconductor device 2 includes a plurality of different transistors TR5 to TR8 formed on semiconductor substrate 100. Similar to the previous exemplary embodiment, the fifth transistor TR5 may be an NFET logic transistor, the sixth transistor TR6 may be a PFET logic transistor, the seventh transistor TR7 may be an NFET memory transistor, and the eighth transistor TR8 may be a PFET memory transistor.

The fifth transistor TR5 may include an interface film pattern 315, a high-k dielectric film pattern 325, a first work function control film pattern 355, a second work function control film pattern 365 and a metal gate pattern 415. The sixth transistor TR6 may further include a P-type work function control film pattern 335, compared to the fifth transistor TR5.

In this exemplary embodiment in accordance with principles of inventive concepts, first work function control film pattern 355 has a first thickness t1, and the second work function control film pattern 365 has a second thickness t2, which is the same as in the previous embodiment. In this exemplary embodiment, the high-k dielectric film pattern 325, the first work function control film pattern 355, the second work function control film pattern 365, and the P-type work function control film pattern 335 may be formed to upwardly extend along sidewalls of a trench 307 formed in the interlayer dielectric film 302, as shown.

In accordance with principles of inventive concepts, seventh transistor TR7 may include an interface film pattern 315, a high-k dielectric film pattern 325, a third work function control film pattern 395, a fourth work function control film pattern 405 and a metal gate pattern 415. The eighth transistor TR8 may further include a P-type work function control film pattern 335, compared to the seventh transistor TR7.

In such an exemplary embodiment, the third work function control film pattern 395 may be formed to have the third thickness t3 smaller than the first thickness t1, and the fourth work function control film pattern 405 may be formed to have the fourth thickness t4 greater than the second thickness t2, which is as described above in reference to the previous exemplary embodiment. However, in this exemplary embodiment, the high-k dielectric film pattern 325, the third work function control film pattern 395, the fourth work function control film pattern 405 and the P-type work function control film pattern 335 may be formed to upwardly extend along sidewalls of a trench 307 formed in the interlayer dielectric film 302, as shown. The other components forming the fifth to eighth transistors TR5 to TR8 are as described above in reference to the previous exemplary embodiment, and descriptions thereof will not be repeated here.

The semiconductor device 2 of this exemplary embodiment is different from the semiconductor device 1 of the previous exemplary embodiment in that it is manufactured using a replacement metal gate (RMG) process. The manufacturing of the semiconductor device 2 using the RMG process may be deduced by one skilled in the art by referring to the previous embodiment, and a detailed description thereof will therefore be omitted.

A semiconductor device according to another exemplary embodiment in accordance with principles of inventive concepts will be described with reference to FIGS. 11 and 12. Semiconductor device 3 may include a memory area upon which a static random access memory (SRAM) is formed as a memory device, and a logic area upon which a logic device is formed, for example.

In an exemplary embodiment in accordance with principles of inventive concepts, the SRAM formed on the memory area may include a pair of inverters INV1 and INV2 connected in parallel between a power supply node VCC and a ground node VSS, and a first pass transistor PS1 and a second pass transistor PS2 connected to output nodes of the respective inverters INV1 and INV2. The first pass transistor PS1 and the second pass transistor PS2 may be connected to a bit line BL and a complementary bit line BL/, respectively. Gates of the first pass transistor PS1 and the second pass transistor PS2 may be connected to a word line WL.

The first inverter INV1 may include a first pull-up transistor PU1 and a first pull-down transistor PD1 connected to each other in series, and the second inverter INV2 may include a second pull-up transistor PU2 and a second pull-down transistor PD2 connected to each other in series. The first pull-up transistor PU1 and the second pull-up transistor PU2 are PMOS transistors, and the first pull-down transistor PD1 and the second pull-down transistor PD2 are NMOS transistors in this exemplary embodiment.

The first inverter INV1 and the second inverter INV2 are configured to form a latch circuit such that an input node of the first inverter INV1 is connected to an output node of the second inverter INV2 and an input node of the second inverter INV2 is connected to an output node of the first inverter INV1, in accordance with principles of inventive concepts.

Figure 11:
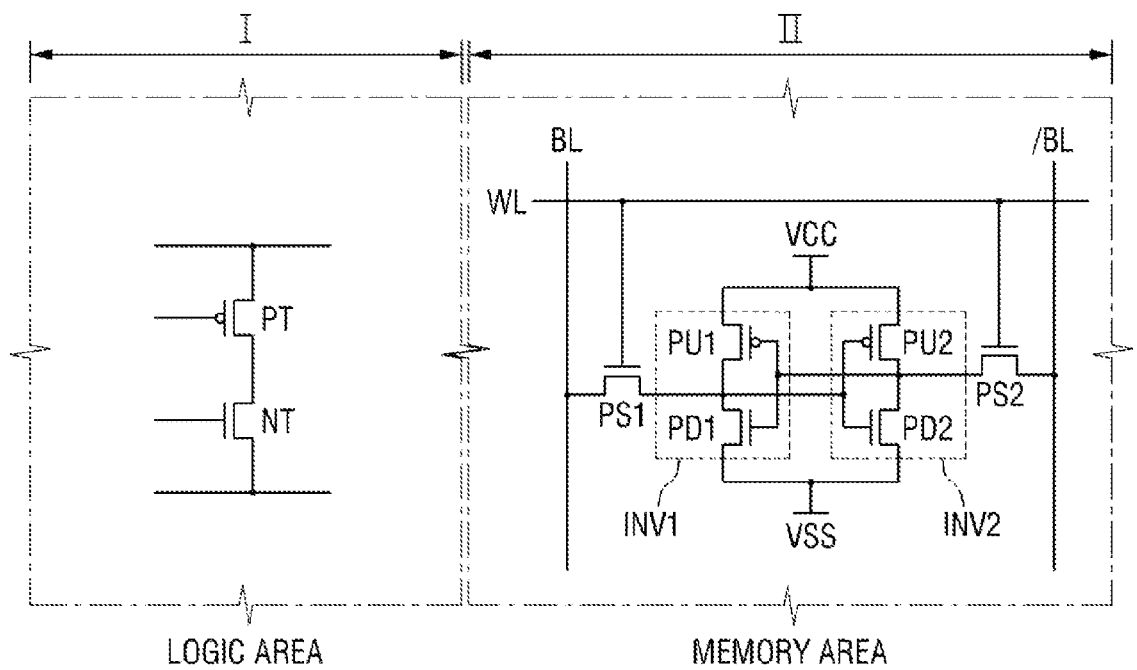
FIGS. 11 and 12 illustrate an exemplary embodiment of a semiconductor device in accordance with principles of inventive concepts.
Figure 12:
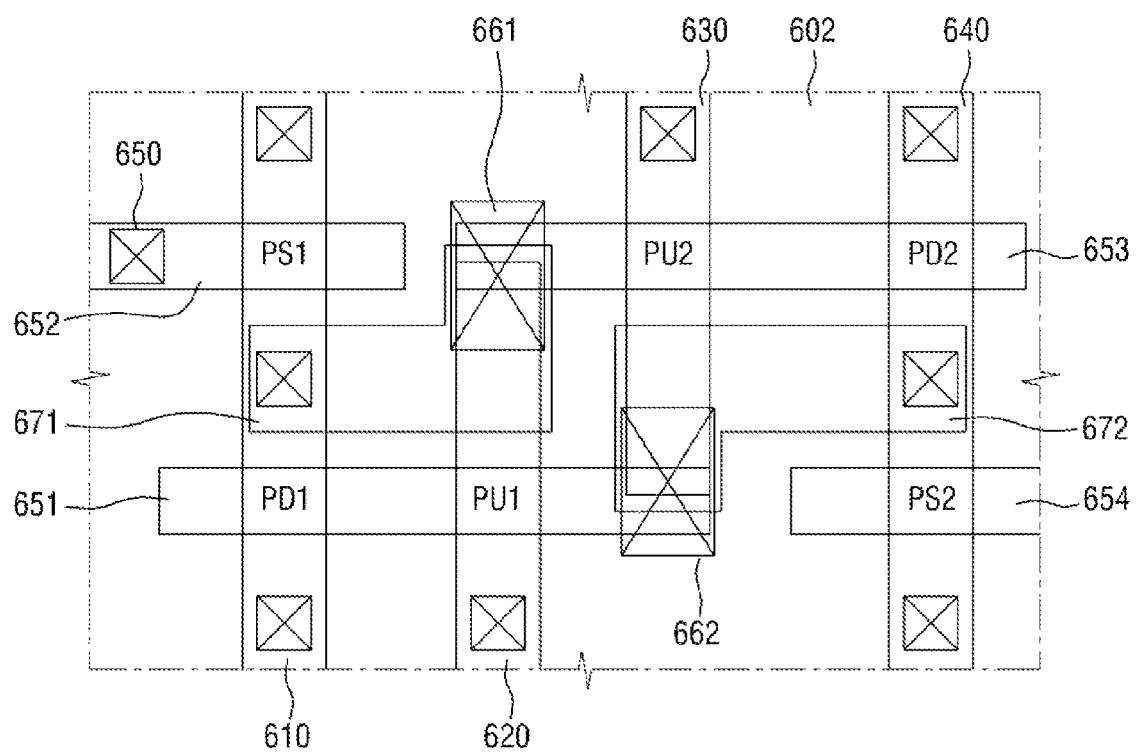

In such an exemplary embodiment, referring to FIGS. 11 and 12, a first active region 610, a second active region 620, a third active region 630, and a fourth active region 640, which are spaced apart from one another, are formed to extend in one direction (for example, in a vertical direction of FIG. 12). The second active region 620 and the third active region 630 may extend to be shorter than the first active region 610 and the fourth active region 640, for example.

A first gate electrode 651, a second gate electrode 652, a third gate electrode 653 and a fourth gate electrode 654 may be formed to extend in the other direction (for example, in a horizontal direction of FIG. 12). The first to fourth gate electrodes 651 to 654 are formed to cross the first to fourth active regions 610 to 640. In particular, the first gate electrode 651 may completely cross the first active region 610 and the second active region 620 and partially overlap a terminal section of the third active region 630. The third gate electrode 653 may completely cross the fourth active region 640 and the third active region 630 and may partially overlap a terminal section of the second active region 620. The second gate electrode 652 and fourth gate electrode 654 may be formed to cross the first active region 610 and the fourth active region 640, respectively.

In this exemplary embodiment in accordance with principles of inventive concepts, the first pull-up transistor PU1 is defined in a region around an intersection of the first gate electrode 651 and the second active region 620, the first pull-down transistor PD1 is defined in a region around an intersection of the first gate electrode 651 and the first active region 610, and the first pass transistor PS1 is defined in a region around an intersection of the second gate electrode 652 and the first active region 610. The second pull-up transistor PU2 is defined in a region around an intersection of the third gate electrode 653 and the third active region 630, the second pull-down transistor PD2 is defined in a region around an intersection of the third gate electrode 653 and the fourth active region 640, and the second pass transistor PS2 is defined in a region around an intersection of the fourth gate electrode 654 and the fourth active region 640.

Although not clearly shown, source/drain may be formed at both sides of the intersections of the first to fourth gate electrodes 651 to 654 and the first to fourth active regions 610, 620, 630 and 640.

A plurality of contacts 650 may be formed and a shared contact 661 simultaneously connects the second active region 620, the third gate line 653, and a wire 671. A shared contact 662 simultaneously connects the third active region 630 a first gate line 651, and a wire 672.

For example, the first pull-up transistor PU1 and the second pull-up transistor PU2 may have the same configurations as the fourth transistor (TR4 of FIG. 1) or the eighth transistor (TR8 of FIG. 10), which has previously been described. The first pull-down transistor PD1, the first pass transistor PS1, the second pull-down transistor PD2 and the second pass transistor PS2 may have the same configurations as the third transistor (TR3 of FIG. 1) or the seventh transistor (TR7 of FIG. 10), which has previously been described, for example.

The logic device formed on the logic area may include a PMOS transistor PT and an NMOS transistor NT. For example, the PMOS transistor PT may have the same configuration as the second transistor (TR2 of FIG. 1) or the sixth transistor (TR6 of FIG. 10), which has previously been described. The NMOS transistor NT may have the same configuration as the first transistor (TR1 of FIG. 1) or the sixth transistor (TR6) of FIG. 10), which has previously been described.

Figure 13:
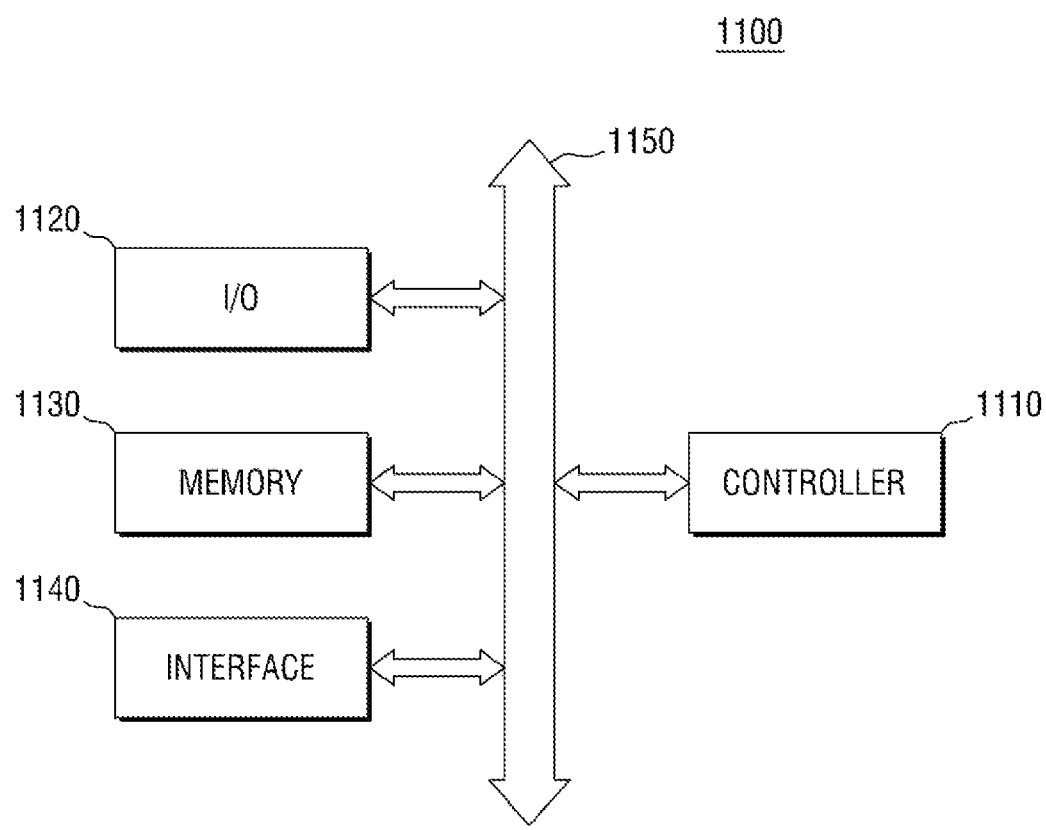
FIG. 13 is a block diagram of an exemplary embodiment of an electronic system including semiconductor memory devices in accordance with principles of inventive concepts.

FIG. 13 is a block diagram of an electronic system including a semiconductor device, such as a memory device, in accordance with principles of inventive concepts. Electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to each other through the bus 1150. The bus 1150 may correspond to a path through which data are transmitted and received.

The controller 1110 may include a microprocessor, digital signal processor, and/or microcontroller, or a logic device that can execute functions similar to these. The I/O device 1120 may include a keypad, a keyboard, and a display device. The memory device 1130 may store data and/or instructions. The interface 1140 may transmit data to a communication network or receives data from a communication network. The interface 1140 may have a wired or wireless form. For example, the interface 1140 may include an antenna or a wire/wireless transceiver. Although not illustrated in FIG. 13, the electric system 1100 may be an operation memory for improving the operation of the controller 1110 and may further include high-speed DRAM and/or SRAM, for example. Transistors in accordance with principles of inventive concepts may be provided in the memory device 1130 or may be provided as part of the controller 1110 or the I/O device 1120, for example.

The electronic system 1100 is applicable to a personal digital assistant (PDA), a portable computer, a web tablet, a mobile phone, a wireless phone, a digital music player, a memory card, or electronic products for transmitting/receiving information in wireless environments, for example.

Figure 14:
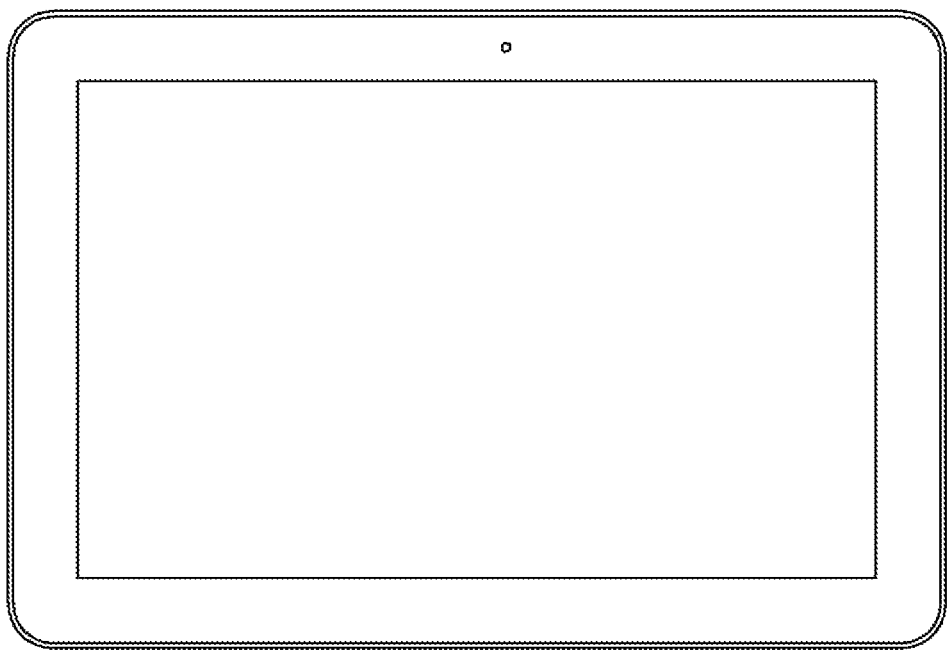
FIGS. 14 and 15 illustrate exemplary semiconductor systems including semiconductor memory devices in accordance with principles of inventive concepts.
Figure 15:
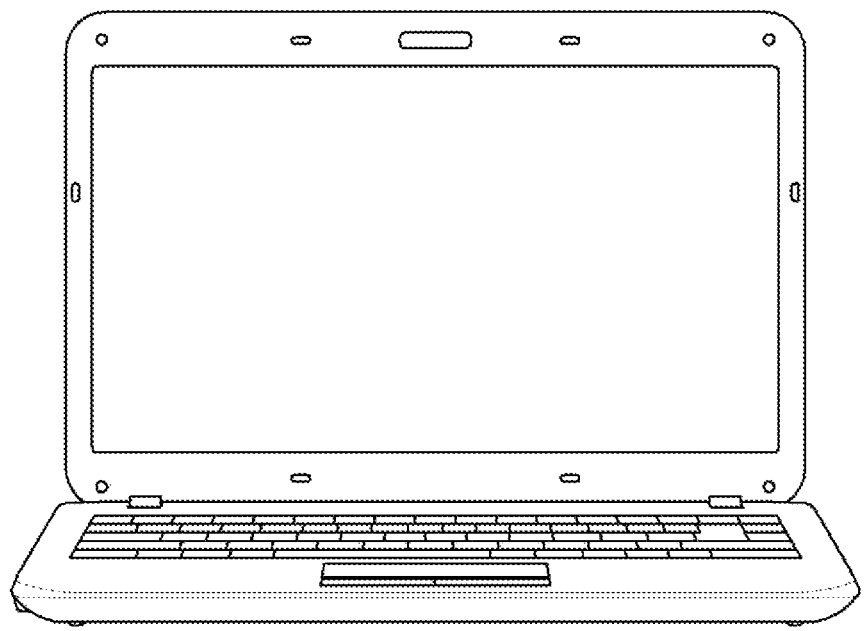

FIGS. 14 and 15 illustrate exemplary semiconductor systems to which the electronic system including semiconductor devices, such as memory devices, in accordance with principles of inventive concepts may be applied.

FIG. 14 illustrates a tablet PC and FIG. 15 illustrates a notebook computer. A semiconductor device in accordance with principles of inventive concepts, such as semiconductor devices 1 to 3 may be applied to the tablet PC shown in FIG. 14 and the notebook computer shown in FIG. 15. It may be apparent to one skilled in the art that the semiconductor devices 1 to 3 in accordance with principles of inventive concepts may also be applied to other devices not illustrated herein.

While exemplary embodiments of inventive concepts have been particularly shown and described, it will be understood by those of ordinary skill in the art that various changes in form and details may be made therein without departing from the spirit and scope of inventive concepts, as defined by the following claims. It is therefore desired that the present exemplary embodiments be considered in all respects as illustrative and not restrictive, reference being made to the appended claims rather than the foregoing description to indicate the scope of the invention.

What is claimed is:
1. A semiconductor device comprising:
a semiconductor substrate including a first region and a second region, wherein the first region is a logic region and the second region is a memory region;
a first high-k dielectric film pattern on the first region;
a second high-k dielectric film pattern of the same thickness as the first high-k dielectric film pattern, on the second region;
a first work function control film pattern on the first high-k dielectric film pattern and having a first thickness;
a second work function control film pattern on the first work function control film pattern and having a second thickness;
a third work function control film pattern on the second high-k dielectric film pattern made of the same material as, and being thinner than, the first work function control pattern; and
a fourth work function control film pattern on the third work function control film pattern made of the same material as, and being thicker than, the second work function control film pattern.

2. The semiconductor device of claim 1, wherein the first and third work function control film patterns include metal oxide film patterns.

3. The semiconductor device of claim 2, wherein the metal oxide film patterns include LaO, $Y_2O_3$, $Lu_2O_3$, SrO or combinations thereof.

4. The semiconductor device of claim 1, wherein the second and fourth work function control film patterns include metal nitride film patterns.

5. The semiconductor device of claim 4, wherein the metal nitride film pattern is one of a single film made of TiN and a double layered film made of TiN/TaN.

6. The semiconductor device of claim 1, wherein the combined thicknesses of the first and second work function control film patterns is equal to the combined thicknesses of the third and fourth work function control film patterns.

7. The semiconductor device of claim 1, wherein the memory region includes a static random access memory (SRAM).

8. The semiconductor device of claim 1, wherein the logic region includes a NFET logic region and a P-type field effect transistor (PFET) logic region, the memory region includes an N-type field effect transistor (NFET) memory region and a PFET memory region, and the semiconductor further comprises a P-type work function control film pattern on the first high-k dielectric film on the PFET logic region and the second high-k dielectric film the PFET memory region and not on the first high-k dielectric film on the NFET logic region and the second high-k dielectric film on the NFET memory region.

9. The semiconductor device of claim 8, wherein the P-type work function control film pattern includes a TiN pattern.

10. The semiconductor device of claim 9, wherein the P-type work function control film pattern has a thickness greater than that of the fourth work function control film pattern.

11. The semiconductor device of claim 1 further comprising:
an interlayer dielectric film on the semiconductor substrate and including a trench, at least one of the first high-k dielectric film pattern, the first work function control film pattern, and the second work function control film pattern arranged to upwardly extend along sidewalls of the trench, and at least one of the second high-k dielectric film pattern, the third work function control film pattern, and the fourth work function control film pattern being arranged to upwardly extend along sidewalls of the trench.

12. A semiconductor device, comprising:
a semiconductor substrate including first and second regions having distinct functional characteristics;
a first high-k dielectric film pattern on the first region;

a second high-k dielectric film pattern of the same thickness as the first high-k dielectric film pattern, on the second region; and work function control film patterns on each of the first and second high-k dielectric film patterns, the ratios of the thicknesses of the work function control film patterns are selected to control the work functions of transistors in the first and second regions, wherein the first region is a logic region including logic devices and the second region is a memory region including memory devices, each region including NFET and PFET transistors, the NFET transistors of the logic region including metal gate patterns equal in thickness to the metal gate patterns of the NFET transistors in the memory region, and the PFET transistors in the logic region including metal gate patterns equal in thickness to the metal gate patterns of the PFET transistors in the memory region, and wherein the logic region includes a first work function control film pattern on the first high-k dielectric film pattern, a second work function control film pattern on the first work function control film pattern; and the memory region includes a third work function control film pattern on the second high-k dielectric film pattern made of the same material as, and being thinner than, the first work function control pattern and a fourth work function control film pattern on the third work function control film pattern made of the same material as, and being thicker than, the second work function control film pattern.

13. A memory module including the semiconductor device of claim 12.

14. A wireless device including the memory module of claim 13.

* * * * *